(12) United States Patent
Ahmadi et al.

(10) Patent No.: US 8,604,840 B2
(45) Date of Patent: Dec. 10, 2013

(54) FREQUENCY SYNTHESIZER NOISE REDUCTION

(75) Inventors: Mahmoud R. Ahmadi, Minneapolis, MN (US); Jafar Savoj, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 107 days.

(21) Appl. No.: 12/491,922

(22) Filed: Jun. 25, 2009

(65) Prior Publication Data
US 2010/0327916 A1 Dec. 30, 2010

(51) Int. Cl.
*G01R 29/00* (2006.01)
*H03D 3/00* (2006.01)
*H03D 9/00* (2006.01)
*G01R 25/00* (2006.01)
*H03H 11/16* (2006.01)
*H03K 5/13* (2006.01)

(52) U.S. Cl.
USPC ............ 327/107; 327/2; 327/3; 327/5; 327/7; 327/12; 327/148; 327/157; 327/231; 327/236; 327/244

(58) Field of Classification Search
USPC ............... 327/2–12, 105, 107, 148, 157, 231, 327/236, 244, 536, 537
See application file for complete search history.

(56) References Cited

U.S. PATENT DOCUMENTS

| | | | |
|---|---|---|---|
| 4,970,475 A | * | 11/1990 | Gillig ............................. 331/25 |
| 5,818,303 A | * | 10/1998 | Oishi et al. .................... 331/1 A |
| 6,426,660 B1 | * | 7/2002 | Ho et al. ........................ 327/175 |
| 6,429,693 B1 | | 8/2002 | Staszewski et al. |
| 6,946,887 B2 | * | 9/2005 | Ho ................................. 327/156 |
| 6,985,551 B1 | | 1/2006 | Mattisson et al. |
| 7,042,970 B1 | * | 5/2006 | Keaveney et al. ............. 375/371 |
| 7,327,820 B2 | | 2/2008 | Meninger et al. |
| 2002/0163325 A1 | | 11/2002 | Nilsson |
| 2007/0159213 A1 | | 7/2007 | Jenkins |
| 2009/0015338 A1 | * | 1/2009 | Frey ................................ 331/16 |
| 2009/0072912 A1 | | 3/2009 | Kim et al. |

OTHER PUBLICATIONS

S. Pamarti, L. Jansson, I. Galton, "A wideband 2.4-GHz delta sigma fractional-N PLL with 1-Mb/s in-loop modulation," IEEE J. Solid-State Circuits, vol. 39, pp. 49-62, Jan. 2004.
S. E. Meninger, M. H. Perrott, "A 1-MHz bandwidth 3.6GHz 0.18-um CMOS fractional-N synthesizer utilizing a hybrid PFD/DAC structure for reduced broadband phase noise," IEEE J. Solid-State Circuits, vol. 41, pp. 966-980, Apr. 2006.

(Continued)

*Primary Examiner* — Lincoln Donovan
*Assistant Examiner* — Colleen O Toole
(74) *Attorney, Agent, or Firm* — Kevin T. Cheatham (57) ABSTRACT

A method for reducing noise in a frequency synthesizer includes selecting a design variable k, calibrating a feedback time delay ($T_d$), such that $T_d = kT_{VCO}$, where $T_{VCO}$ is the period of the synthesizer output signal. The method further includes estimating an instantaneous quantization error to a number of bits equal to q, defining a reference bias current of $I_{cp}/(k2^q)$, where $I_{cp}$ is a charge pump current signal, and applying the estimated instantaneous quantization error to a current array to produce a down modification signal ($\Delta I$). The current array is biased by the reference bias current. The down modification signal ($\Delta I$) is summed with the charge pump current signal $I_{cp}$ to modulate a down current portion of the charge pump current signal $I_{cp}$.

29 Claims, 8 Drawing Sheets

(56) References Cited

OTHER PUBLICATIONS

S.E. Meninger, "Low Phase Noise, High Bandwidth Frequency Synthesis Techniques", Massachusetts Institute of Technology, May 2005.

A. Swaminathan, et al., "A wide-bandwidth 2.4 GHz ISM band fractional-N PLL with adaptive phase noise cancellation", IEEE Journal of Solid-State Circuits, vol. 42, pp. 2639-2650, Dec. 2007.

S. Pamarti, et al., Addition to "A Wideband 2.4-GHz Delta-Sigma Fractional-N PLL With 1-Mb/s In-Loop Modulation", IEEE Journal of Solid-State Circuits, vol. 40, p. 559, Feb. 2005.

International Search Report and Written Opinion—PCT/US2010/040043, International Search Authority—European Patent Office—Feb. 17, 2011.

Meninger S E, et al., "A Dual Band 1.8GHz/900MHz, 750kb/s GMSK Transmitter Utilizing a Hybrid PFD/DAC Structure for Reduced Broadband Phase Noise", VLSI Circuits, 2005. Digest of Technical Papers. 2005 Symposium on, IEEE, Piscataway, NJ, USA LNKDDOI: 10.1109/VLSIC.2005.1469412, Jun. 16, 2005, pp. 394-397, XP010818456.

\* cited by examiner

FREQUENCY SYNTHESIZER NOISE REDUCTION

BACKGROUND

1. Field

This disclosure is generally related to wireless communications, and more particularly, to techniques for noise reduction for frequency synthesizers, such as delta-sigma noise reduction for wideband fractional-N frequency synthesizers.

2. Background

Synthesizers, such as fractional-N frequency synthesizers, are an important block in integrated wireless chips for diverse applications, such as chips for wireless communication systems. The synthesizer block generates the band selection, or local oscillator (LO) frequency, that may be used as a carrier in a wireless communication system.

In some applications, faster band selection mechanisms are desired. Faster band selection mechanisms are generally related to the extension of synthesizer loop bandwidth. Increasing the loop bandwidth generally reduces the loop settling time, and also generally relaxes the voltage controlled oscillator (VCO) design constraints, such as phase noise and power.

A sigma-delta modulator (SDM) that may be used in the synthesizer has been one of the major limiting factors in increasing the loop bandwidth due to a natural high pass frequency response. The impact of the natural high pass frequency response noise is more pronounced when using larger loop bandwidths. Consequently, fractional spurs may appear in the final spectrum and phase noise performance may be degraded.

Advances in communication systems lead to a consistent need for synthesizers with better performance and smaller area requirements. The need for wide bandwidth and low reference frequencies results in sigma delta quantization noise and higher integrated phase noise.

Various techniques have been employed to reduce delta-sigma noise in frequency synthesizers. One technique, discussed by Pamarti, et al., in "A wideband 2.4-GHz sigma delta fractional-N PLL with 1-Mb/s in-loop modulation," IEEE J. Solid-State Circuits, vol. 39, pp. 49-62, January, 2004, which is entirely incorporated herein, describes a direct cancellation method that uses the error information from the SDM with negative polarity. The error information is then re-quantized and applied through a digital-to-analog converter (DAC) to the output of a charge pump to cancel the SDM error fed by the modulator and divider. However, the inherent mismatch in the direct cancellation method between the accumulated error within the loop and the correction path may limit the correction of the SDM error.

Another technique, discussed by Meninger and Perrott, in "A 1-MHz bandwidth 3.6 GHz 0.18-um CMOS fractional-N synthesizer utilizing a hybrid PFD/DAC structure for reduced broadband phase noise," IEEE J. Solid-State Circuits, vol. 41, pp. 966-980, April, 2006, which is entirely incorporated herein, describes combination phase frequency detector/digital-to-analog converter (PFD/DAC) techniques that use the charge balance basics and an offset PFD. A correction window with the width of the period of the synthesized output signal ($T_{VCO}$) is created and a charge pump pull down current is varied as a function of the accumulated error within that window. Such combination PFD/DAC techniques may have implementation costs associated with changing the PFD to incorporate up to four high speed flip flops running with the VCO clock and may be limited to accumulator based frequency synthesizers Using higher-order sigma delta based frequency synthesizers may degrade the performance of combination PFD/DAC techniques though the techniques best cancel the error when used with a simple sigma delta modulator or an accumulator.

Frequency synthesizers would benefit from more efficient noise reduction technique, including techniques to reduce the delta-sigma noise. Frequency synthesizers would benefit from an increase in the bandwidth of the synthesizer without the penalty of the closed loop phase noise. Various techniques have been employed to decrease noise in frequency synthesizers. However, the previous attempts remain inadequate to optimize the operation of the frequency synthesizers. Therefore, there is need for improvement.

SUMMARY

In accordance with one aspect of the disclosure, an apparatus includes a phase frequency detector, charge pump, a summer, an error estimator, and a current modification array. The phase frequency detector is configured to detect a phase error in a frequency synthesizer loop and to provide an up current control signal and a down current control signal based upon the detected phase error. The charge pump is configured to provide a charge pump current signal ($I_{cp}$) based on the up current control signal and the down current control signal. The charge pump current signal ($I_{cp}$) is proportional to the phase error detected by the phase frequency detector. The charge pump current signal includes a down current portion based upon the down current control signal, The summer is configured to receive the charge pump current signal ($I_{cp}$) and to modulate the down current portion with a down modification signal ($\Delta I$). The error estimator is configured to receive an instantaneous quantization error ($e_i$) signal and to provide an estimated instantaneous quantization error signal. The current modification array is configured to receive the estimated instantaneous quantization error signal and to provide the down modification signal ($\Delta I$) having a variable period based on the instantaneous quantization error.

In accordance with another aspect, a method of reducing noise in a frequency synthesizer includes selecting a design variable k; calibrating a feedback time delay ($T_d$), such that $T_d = kT_{VCO}$, where $T_{VCO}$ is the period of the synthesizer output signal; estimating an instantaneous quantization error to a number of bits equal to q; defining a reference bias current of $I_{cp}/(k2^q)$, where $I_{cp}$ is a charge pump current signal; applying the estimated instantaneous quantization error to a current array to produce a down modification signal ($\Delta I$), where the current array is biased by the reference bias current; and summing the down modification signal ($\Delta I$) with the charge pump current signal $I_{cp}$ to modulate a down current portion of the charge pump current signal $I_{cp}$.

In accordance with another aspect, a method of calibrating a feedback time delay $T_d$ includes comprising measuring the feedback time delay ($T_d$); dividing a feedback clock to produce a plurality of adjustment reference signals; determining the width of the feedback time delay ($T_d$) using the plurality of adjustment reference signals; and adjusting the feedback time delay ($T_d$) to $k/f_{VCO}$, where $f_{VCO}$ is the frequency of a voltage controlled oscillator output signal.

In accordance with another aspect, an apparatus includes means for selecting a design variable k; means for calibrating a feedback time delay ($T_d$), such that $T_d = kT_{VCO}$, where $T_{VCO}$ is the period of a frequency synthesizer output signal; means for estimating an instantaneous quantization error to a number of bits equal to q; means for defining a reference bias current of $I_{cp}/(k2^q)$, where $I_{cp}$ is a charge pump current signal; means for applying the estimated instantaneous quantization error to a current array to produce a down modification signal (ΔI), where the current array is biased by the reference bias current; and means for summing the down modification signal (ΔI) with the charge pump current signal $I_{cp}$ to modulate a down current portion of the charge pump current signal $I_{cp}$.

In accordance with another aspect, an apparatus includes means for measuring a feedback time delay ($T_d$); means for dividing a feedback clock to produce a plurality of adjustment reference signals; means for determining the width of the feedback time delay ($T_d$) using the plurality of adjustment reference signals; and means for adjusting the feedback time delay ($T_d$) to $k/f_{VCO}$, where $f_{VCO}$ is the frequency of a voltage controlled oscillator output signal.

Other systems, methods, aspects, features, embodiments and advantages of the improved techniques for noise reduction for frequency synthesizers disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the apparatus and methods disclosed herein. In the figures, like reference numerals designate corresponding parts throughout the different views.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The word "exemplary" is used herein to mean "serving as an example, instance, or illustration." Any feature, embodiment or variant described herein as "exemplary" is not necessarily to be construed as preferred or advantageous over other features, embodiments or variants. All of the embodiments and variants described in this description are exemplary embodiments and variants provided to enable persons skilled in the art to make and use the invention, and not necessarily to limit the scope of legal protection afforded the appended claims.

The techniques presented here may be adopted in wideband fractional-N frequency synthesizers for various wireless applications in order to efficiently suppresses delta-sigma noise and increase the performance of the synthesizer.

Figure 1:
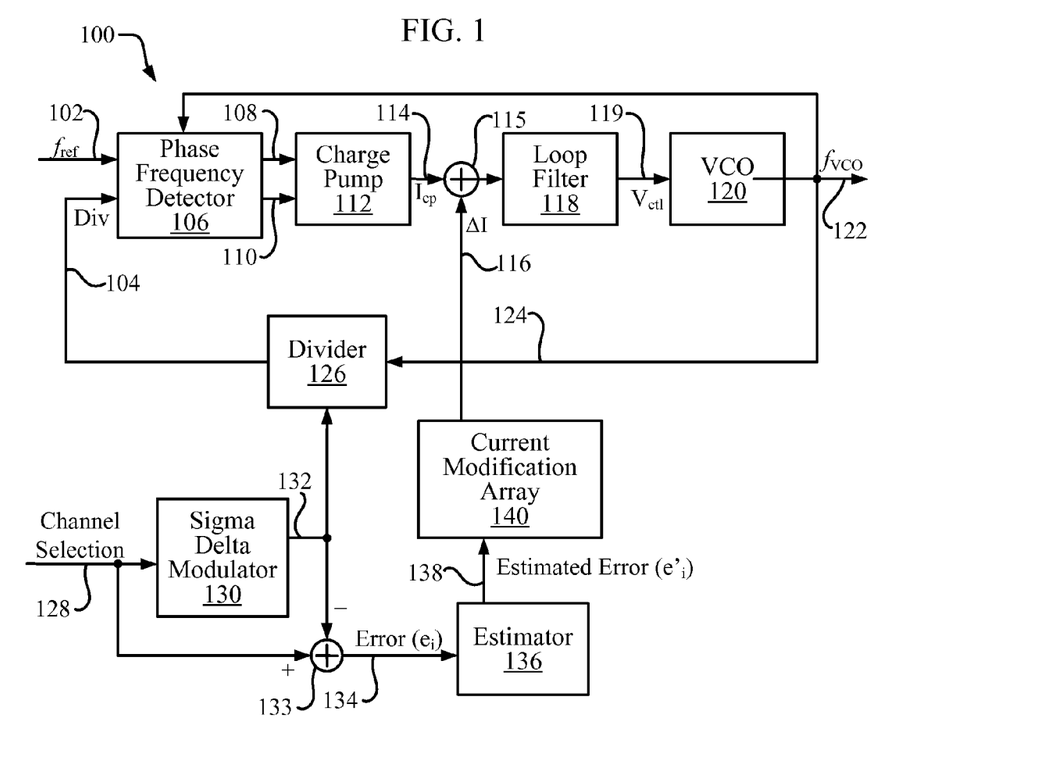
FIG. 1 is a block diagram of a frequency synthesizer.

FIG. 1 is a block diagram of a frequency synthesizer 100 including a phase frequency detector (PFD) 106, a charge pump 112, a summing node 115, a loop filter 118, a voltage controlled oscillator (VCO) 120, a divider 126, a sigma delta modulator (SDM) 130, a summing node 133, an estimator 136, and a current modification array 140. During operation, a reference oscillator (not shown) generates a reference signal that is received on a line 102. The reference signal may have a frequency of $f_{ref}$ which is relatively precise. Examples of suitable reference oscillators include crystal oscillators (XOs), voltage controlled crystal oscillators (VCXOs), temperature-compensated crystal oscillator (TCXOs), voltage-controlled TCXOs (VC-TCXOs). In some circumstances, the frequency synthesizer 100 provides an output signal from the VCO 120 to other components of the wireless system such as a local oscillator (not shown).

The PFD 106 receives the reference signal from the reference oscillator and a divider feedback signal (Div) from the divider 126 on a line 104. The PFD 106 compares the phases of the two signals to determine a phase error and provides an up current control signal on a line 108 and a down current control signal on a line 110. The up current control signal indicates the phase difference/error between the reference signal and the divide feedback signal. The down current control signal corrects quantization noise error in the up current control signal. The charge pump 112 generates a charge pump current signal ($I_{cp}$) on a line 114 that is proportional to the phase error detected by the PFD 106. The summing node 115 combines the charge pump current signal ($I_{cp}$) with a down modification signal (ΔI) on a line 116.

The loop filter 118 filters the output of the summing node 115 and provides a control signal ($V_{ctl}$) for the VCO 120 on a line 119. As discussed below with reference to FIG. 2, the loop filter 118 filters the current difference between the pump up current of an up current source and the pump down current of a down current source of the charge pump. The loop filter 118 adjusts the control signal ($V_{ctl}$) such that the phase and frequency of the divider feedback signal (Div) on the line 104 is locked to the phase and frequency of the reference signal on the line 102. The loop filter 118 has a frequency response that may be selected to achieve the desired closed-loop response through the control signal ($V_{ctl}$). For example, the frequency response of the loop filter 118 may be selected based on a tradeoff between acquisition and tracking performance and noise performance.

The VCO 120 generates a VCO output signal having a synthesized frequency ($f_{VCO}$) on a line 122. The frequency ($f_{VCO}$) is determined by the VCO control signal ($V_{ctl}$). The divider 126 divides the VCO output signal on a line 124 in frequency by a divide factor and provides the divider feedback signal (Div) on the line 104. The divide factor may be an integer and/or a non-integer, such as the average value of N+y[n] over time, where N is an integer and y[n] is a sequence of integers.

The SDM 130 receives a channel selection signal on a line 128 and provides a divider selection signal on a line 132. The divider selection signal may be, for example, of the form y[n], where y[n] may be from a set of {0, 1, 2, 3} for a two-bit sigma delta modulator and y[n] may also be from a set of {0, 1 } for binary sigma delta modulators. The threshold for the SDM 130 may be adjusted based on the form of y[n] employed in any particular application. For example, for a binary sigma delta modulator the threshold may be set to 0.5 and for a two-bit sigma delta modulator the threshold may be set to {0.5, 1.5, 2.5}.

Though a structure for the SDM 130 is provided to illustrate an embodiment, the techniques described herein may be practiced with a variety of sigma delta modulators, such as but not limited to, multi-bit sigma delta modulators, binary sigma delta modulators, and multi-stage noise shaping (MASH).

The channel selection signal is also combined with the inverse of the divider selection signal in the summing node 133 to provide an instantaneous quantization error ($e_i$) signal on a line 134. The estimator 136 may be any of several types of estimating devices such as, but not limited to, a truncators, and re-quantizers. If the estimator 136 is a truncator, the estimator 136 truncates a number of least significant bits (LSBs) from the instantaneous quantization error ($e_i$) signal to provide an estimated instantaneous quantization error ($e'_i$) signal on a line 138. If the estimator 136 is a re-quantizer, the estimator 136 provides a series of samples of the instantaneous quantization error ($e_i$) signal to provide the estimated instantaneous quantization error ($e'_i$) on the line 138. The current modification array 140 provides the down modification signal ($\Delta I$) on the line 116.

FIG. 1 illustrates an exemplary design of the frequency synthesizer 100. The frequency synthesizer 100 may also include different and/or additional blocks. Each block within frequency synthesizer 100 may be implemented with digital circuits, analog circuits, or a combination of both. Accordingly, the various functions and operations of the blocks described with reference to the frequency synthesizer 100 may be implemented in any number of devices, circuits, or elements. Two or more of the functional blocks may be integrated in a single device and the functions described as performed in any single device may be implemented over several devices.

The frequency synthesizer 100 may support multiple frequency channels for one or more systems and one or more frequency bands. Each frequency channel may have a specific center frequency. The frequency synthesizer 100 may be controlled to generate the proper VCO signal on the line 122, which may be used by the LO generator (not shown) to generate the LO signal at the proper frequency and with the desired characteristics for the selected frequency channel. For example, the desired VCO frequency $f_{VCO}$ be obtained by choosing the proper overall divider ratio for divider 126. The desired VCO signal characteristics may be obtained by controlling the gain of phase frequency detector 106, the amount of current in the charge pump 112, the component values of the loop filter 118, the configuration of divider 126, and/or the supply voltages for the various components.

Figure 2:
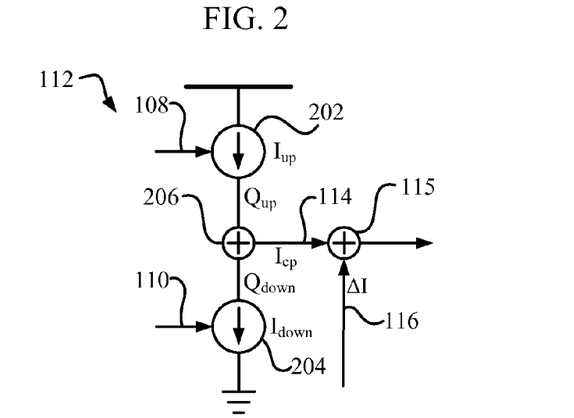
FIG. 2 is a block diagram of a charge pump associated with the frequency synthesizer of FIG. 1.

FIG. 2 is block diagram of the charge pump 112. The charge pump 112 includes the up current source 202, the down current source 204, and a summing node 206. The up current source 202 is controlled by the up current control signal on the line 108, and the down current source 204 is controlled by the down current control signal on the line 110.

The up current source 202 produces a $Q_{up}$ charge based on a current $I_{up}$ for a feedback time delay ($T_d$) period. The down current source 204 produces a $Q_{down}$ charge based on a current $I_{down}$. The loop filter 118 filters the current difference between the pump up current of the up current source 202 and the pump down current of the down current source 204.

Figure 3:
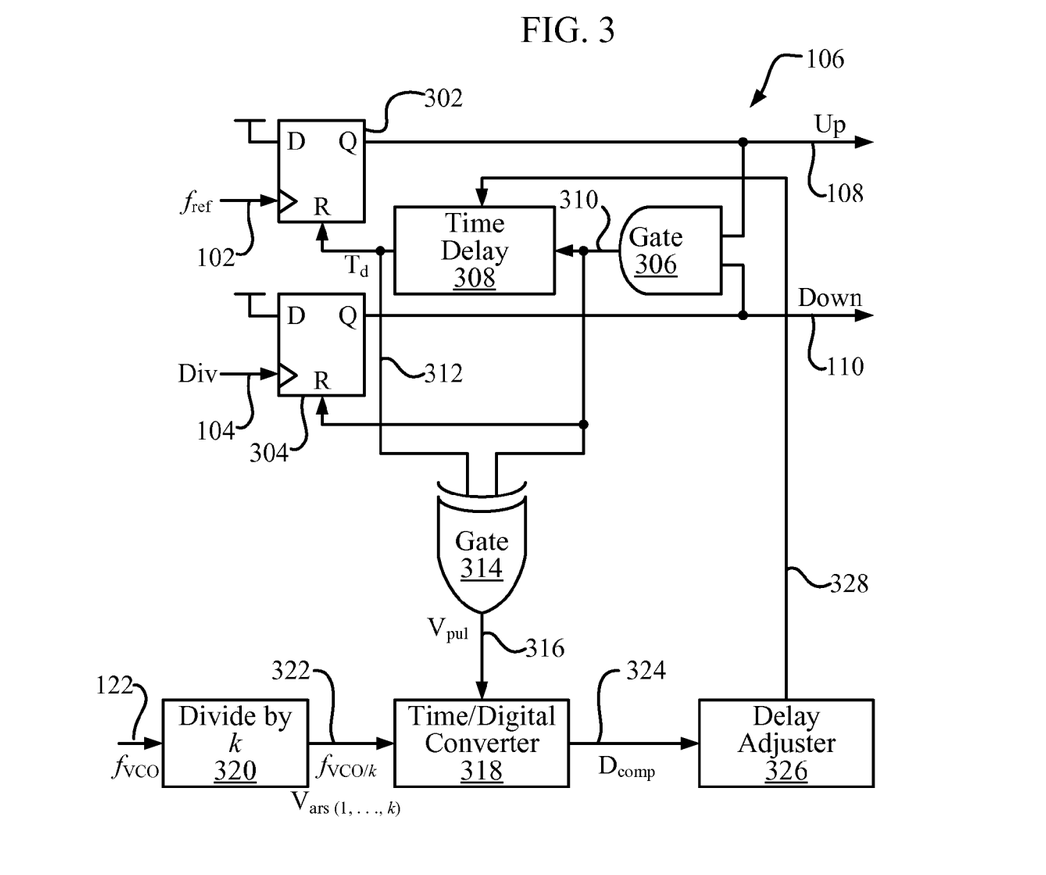
FIG. 3 is a block diagram of a phase frequency detector associated with the frequency synthesizer of FIG. 1.

FIG. 3 is a block diagram of the phase frequency detector 106 of FIG. 1. In one example, the phase frequency detector 106 employs an offset architecture as shown in FIG. 3 to maintain a constant up pulse duration while a down pulse duration is modulated with the accumulated error from the SDM 130. As shown below, for example, the phase frequency detector 106 maintains the constant up pulse 902 duration (see FIG. 9) while the down pulse 904 duration (see FIG. 9) is modulated with the accumulated error 906 (see FIG. 8) from the SDM 130. The down modification signal ($\Delta I$) summed with the total charge pump current signal ($I_{cp}$) at the summing node 115 may vary from one cycle to the next cycle.

The phase frequency detector 106 includes a flip flop 302, a flip flop 304, a NAND gate 306, a feedback time delay block 308, an exclusive OR (XOR) gate 314, a time/digital converter 318, a divide by k function block 320, and a delay adjuster 326. The NAND gate 306 receives inputs from the up current control signal on the line 108 and the down current control signal on the line 110 and provides a NAND gate output signal on a line 310.

The time delay block 308 receives the NAND gate output signal and a delay adjustment signal on a line 328. The time delay block 308 may be programmable and variable, for example the time delay block 308 may vary between 1 ns and 3 ns in some embodiments. The time delay block 308 provides a feedback time delay ($T_d$) signal on a line 312. The XOR gate 314 receives the NAND gate output signal on the line 310 and the feedback time delay ($T_d$) signal on the line 312 and provides an XOR gate 314 output signal ($V_{pul}$) on a line 316.

The divide by k function block 320 receives a VCO output signal having a synthesized frequency ($f_{VCO}$) from line 122 and provides a k divided signal ($f_{VCO}/k$) on a line 322. This operation results in a plurality of adjustment reference signals ($V_{ars(1, \ldots, k)}$) from 1 to k. The time/digital converter 318 receives the plurality of adjustment reference signals ($V_{ars(1, \ldots, k)}$) and the XOR gate 314 output signal ($V_{pul}$) and provides a delay compensation signal ($D_{comp}$) on a line 324. The delay adjuster 326 receives the delay compensation signal ($D_{comp}$) and provides a delay adjustment signal on the line 328 to the time delay block 308.

As described herein, the phase frequency detector 106 modulates the $Qd_{down}$ charge produced by the charge pump 112 and associated with the down current control signal on the line 110, while the width of the $Q_{up}$ charge produced by the charge pump 112 and associated with the up current control signal on the line 108 remains constant.

Figure 4:
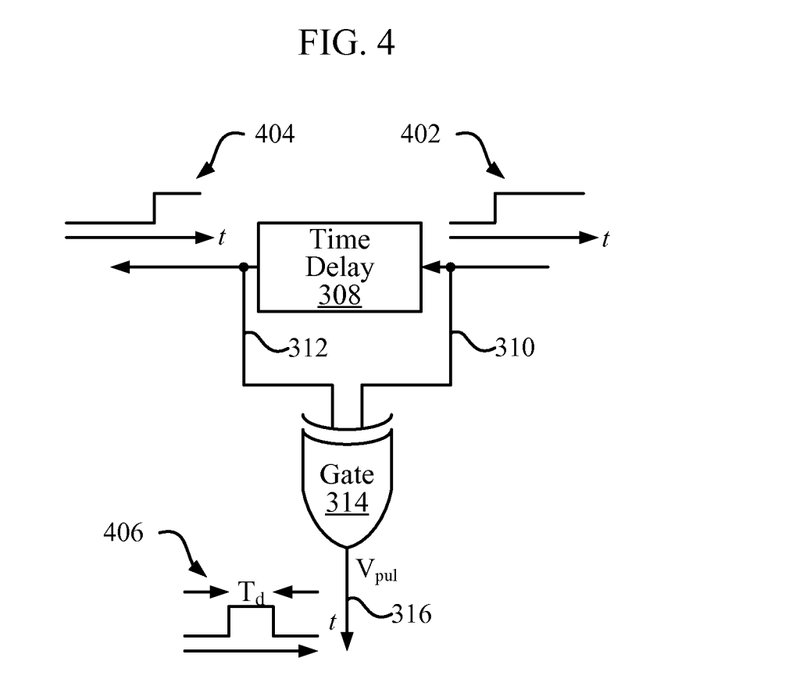
FIG. 4 is a combination timing and block diagram illustrating a portion of the operation of the phase frequency detector of FIG. 3.

FIG. 4 shows a timing diagram of exemplary signals passing through the time delay block 308 and the result of the operation of the XOR gate 314. The exemplary NAND gate output signal 402 on the line 310 is delayed by the time delay block 308 and the exemplary time delayed signal 404 is provided on the line 312. The exemplary XOR gate 314 output signal 406 is provided on the line 316.

Figure 5:
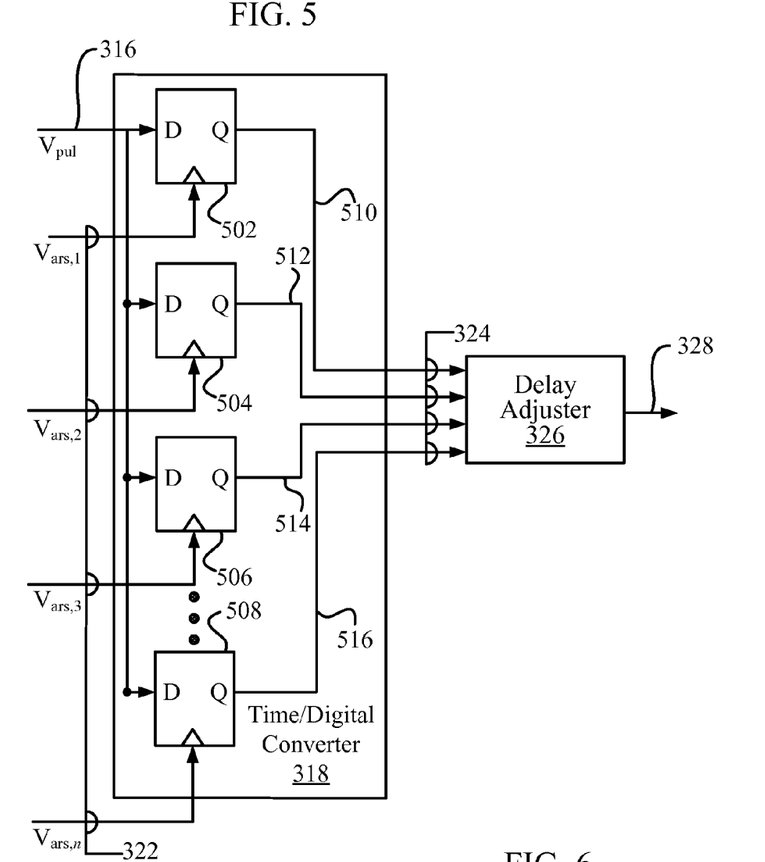
FIG. 5 is a block diagram of a time/digital converter associated with the phase frequency detector of FIG. 3.

FIG. 5 shows a block diagram of the time/digital converter 318 and the delay adjuster 326. The time/digital converter 318 includes a plurality of flip flop samplers 502, 504, 506, and 508 having a D input, a Q output, and a clock input. Sampler 502 receives the XOR gate 314 output signal ($V_{pul}$) at a sampler 502 D input from the line 316 and the first k divided signal ($V_{ars,1}$) at the sampler 502 clock input, and provides a first sampler output on a line 510. Sampler 504 receives the XOR gate 314 output signal ($V_{pul}$) at a sampler 504 D input and the second k divided signal ($V_{ars,2}$) at the sampler 504 clock input, and provides a second sampler output on a line 512. Sampler 506 receives the XOR gate 314 output signal ($V_{pul}$) at a sampler 506 D input and the third k divided signal ($V_{ars,3}$) at the sampler 506 clock input, and provides a third sampler output on a line 514. Sampler 508 receives the XOR gate 314 output signal ($V_{pul}$) at a sampler 508 D input and the $n^{th}$ k divided signal ($V_{ars,n}$) at the sampler 508 clock input, and provides an $n^{th}$ sampler output on a line 516.

The delay adjuster 326 is a digital decision circuit that receives the sampler outputs on the lines 510, 512, 514, and 516 and monitors the sampler outputs for consecutive ones (m) for comparison to the design variable k. Where m>k, feedback time delay ($T_d$) is too long. Where m<k, feedback time delay ($T_d$) is too short. Where m=k, feedback time delay ($T_d$) length is optimum.

Figure 6:
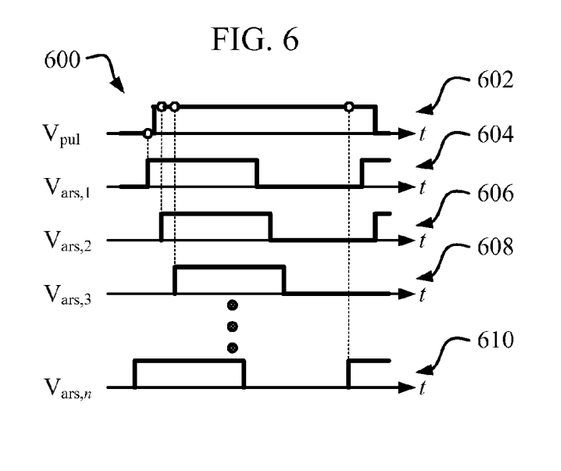
FIG. 6 is a timing diagram associated with the operation of the phase frequency detector of FIG. 3.

FIG. 6 is a timing diagram 600 associated with the time/digital converter 318 and the delay adjuster 326. FIG. 6 illustrates an exemplary XOR gate 314 output signal ($V_{pul}$) 602, an exemplary first k divided signal ($V_{ars,1}$) 604, an exemplary second k divided signal ($V_{ars,2}$) signal 606, an exemplary third k divided signal ($V_{ars,3}$) signal 608, and an exemplary $n^{th}$ k divided signal ($V_{ars,n}$) signal 610. Timing diagram 600 illustrates that rising edges of the adjustment reference signals on the line 322 may be used to sample the XOR gate 314 output signal ($V_{pul}$) on the line 316 to determine if the width of the XOR gate 314 output signal ($V_{pul}$) is longer or shorter than one adjustment reference signal.

Figure 7:
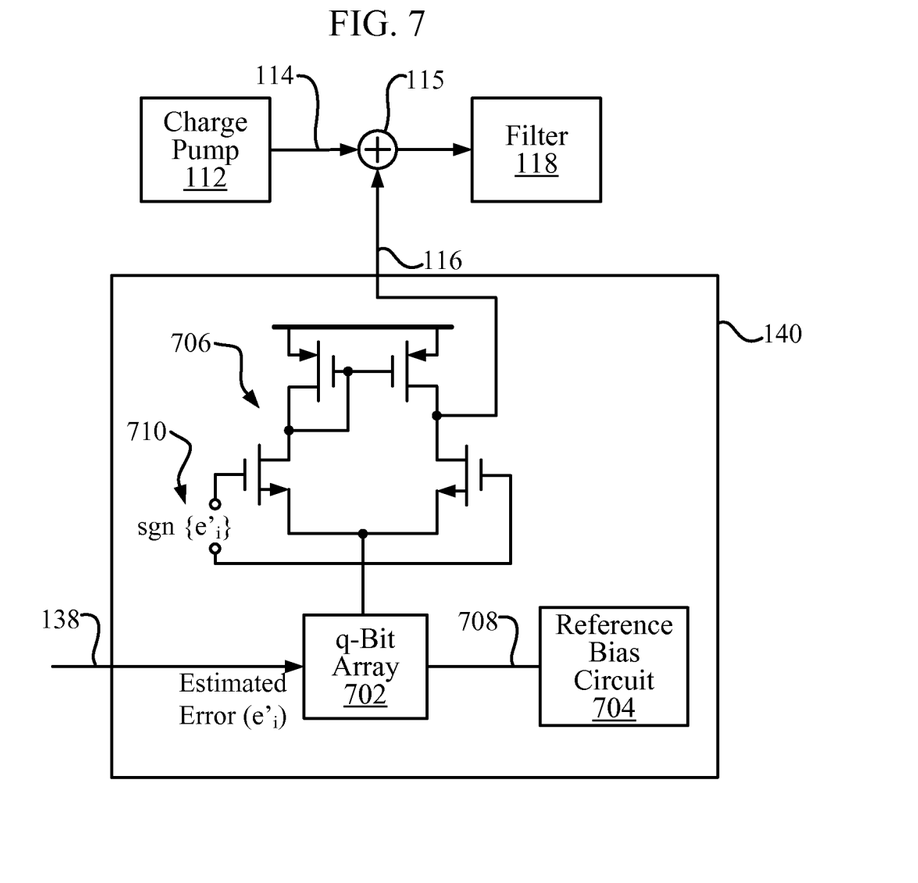
FIG. 7 is a block and schematic diagram of a current modification array associated with the frequency synthesizer of FIG. 1.

FIG. 7 shows the charge pump 112, the loop filter 118, and a block and schematic diagram of the current modification array 140 of FIG. 1. The current modification array 140 includes a q-bit array 702, a reference bias circuit 704, and a PMOS current mirror 706. The q-Bit array 702 receives the estimated instantaneous quantization error ($e'_i$) signal from the line 138 and a reference bias signal from the reference bias circuit 704 on a line 708. The size of the q-bit array 702 is determined by the bits, q, of the estimated instantaneous quantization error ($e'_i$) signal, for example the most significant bits (MSBs), q, after the estimator 136 for example, truncates and/or estimates the instantaneous quantization error $e_i$. By truncating the instantaneous quantization error bits, for example to its 5-7 MSBs, the design of the q-Bit Array 702 becomes more practical for situations where the instantaneous quantization error ($e_i$) may be of much greater resolution. For example, in some systems, SDM instantaneous quantization error may include 24, or more, bits of resolution, which might lead to an inefficiently large q-bit array.

The PMOS current mirror 706 provides the down modification signal ($\Delta I$) on the line 116. The PMOS current mirror 706 can be used to adjust the sign of the down modification signal ($\Delta I$) through a sign function 710.

Figure 8:
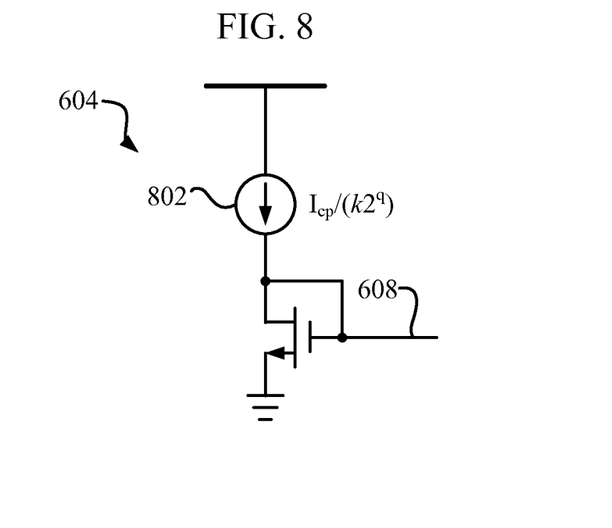
FIG. 8 is a schematic diagram of a reference bias circuit associated with the current modification array of FIG. 7.

FIG. 8 shows the reference bias circuit 704. The reference bias circuit 704 includes a current source 802 providing an $I_{cp}/(k2^q)$ current.

Figure 9:
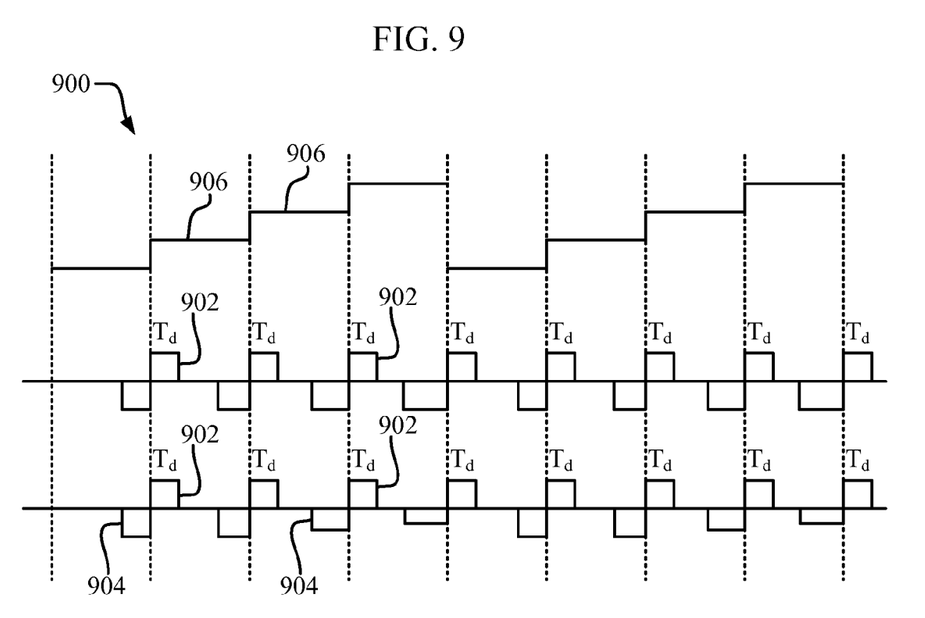
FIG. 9 is a timing diagram timing diagram associated with the operation of the frequency synthesizer of FIG. 1.

FIG. 9 is an exemplary timing chart 900 illustrating a plurality of the up pulses 902, a plurality of the down pulses 904, and the accumulated error 906 from the SDM 130. Timing chart 900 illustrates maintaining a constant up pulse 902 duration while a down pulse 904 duration is modulated with the accumulated error 906 from the SDM 130. The width of the down pulse 904 is modulated by the accumulated error 906 in the phase frequency detector 106. Using the accumulated error 906 information, down current from the down current source 204 is modulated to reverse the impact of the pulse width modulation. This allows the instantaneous charge to cancel the charge of the up current from the up current source 202.

In order to reduce noise, the down modification signal ($\Delta I$) on the line 116 is summed with the total charge pump current signal ($I_{cp}$) on the line 114 to compensate for the error resulting from the phase difference between the divider feedback signal (Div) on the line 104 and the reference signal on the line 102. The charge pump 112 down current $I_{down}$ may be modified based on the accumulated error value to preserve the negative injected charge to the control signal for VCO 120 to $Q_{up}=I_{up}T_d$. To derive the desired value for the down modification signal ($\Delta I$), the charges generated by the charge pump 112 are initially set as equivalent, $$Q_{down}=Q_{up} \qquad \text{Eq. (1)}$$

where "$Q_{down}$" is the charge produced by the down current source 204, and "$Q_{up}$" is the charge produced by the up current source 202.

Changing the form to incorporate the time elements results in, $$(I_{cp}+\Delta I)(T_d+e_iT_{VCO})=I_{cp}T_d \qquad \text{Eq. (2)}$$

where "$I_{cp}$" is the charge pump current signal, and "$\Delta I$" is the down modification signal, "$T_d$" is the feedback time delay, "$T_{VCO}$" is the period of the synthesized output signal, and "$e_i$" is the instantaneous quantization error.

Changing the form and approximating results in, $$1+\Delta I/I_{cp}=1/(1+e_iT_{VCO}/T_d)\approx 1-e_iT_{VCO}/T_d \qquad \text{Eq. (3)}$$

And further modification of the form results in, $$\Delta I/I_{cp}\approx -e_iT_{VCO}/T_d=-e_i/k(T_d=T_{VCO}k) \qquad \text{Eq. (4)}$$

where "k" is a design specific variable that in one embodiment is a modulo-2 integer number as such a choice may simplify the design of the synthesizer. In some embodiments, k is preferably selected as 8, and in others as 16.

Eq. 4 may be transformed and approximated as follows, $$\Delta I\approx -(I_{cp}/k)e_i \qquad \text{Eq. (5)}$$

Figure 10:
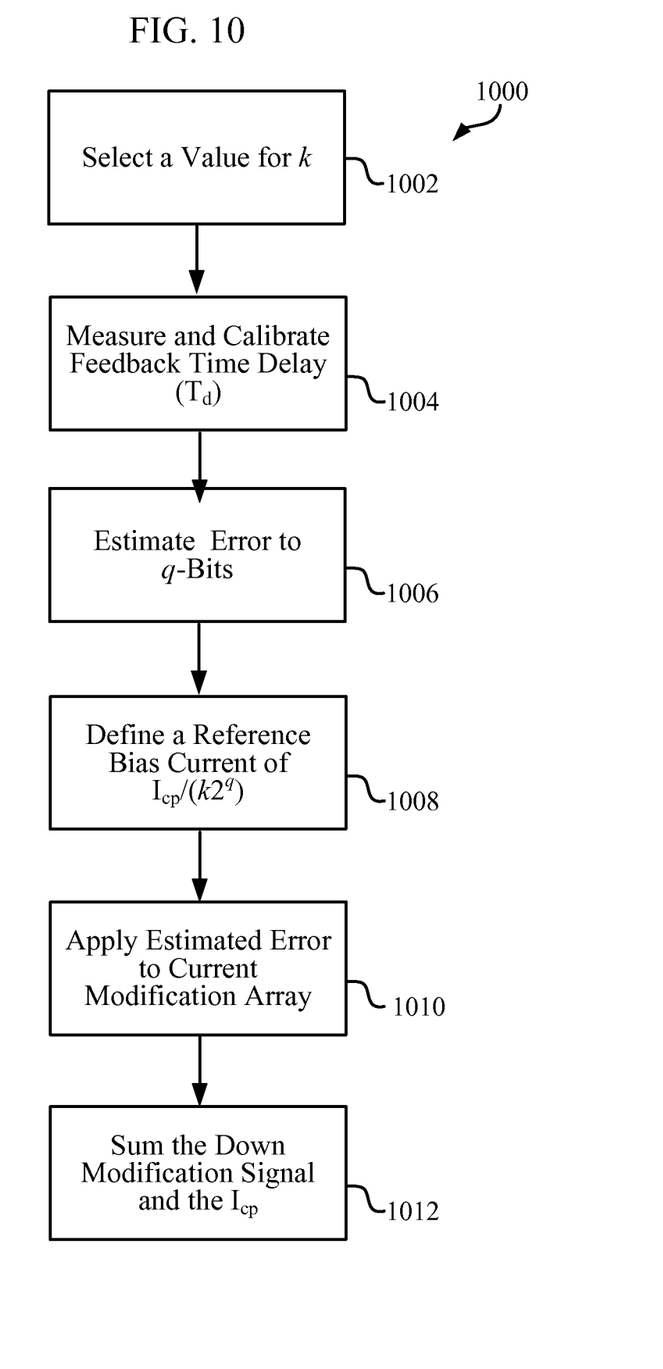
FIG. 10 is a flowchart illustrating a method of reducing noise, such as noise generated in the frequency synthesizer of FIG. 1.

FIG. 10 is a flowchart illustrating a method 1000 of reducing noise and increasing the performance of a synthesizer, for example frequency synthesizer 100. In block 1002 of the method 1000, an integer value for k is selected. In one embodiment, the value of k is selected to be large enough to validate the approximation of Eq. (4). For example, an integer value of 8 may be selected for the value of k.

In block 1004, the feedback time delay ($T_d$) is measured and calibrated. For example, feedback time delay ($T_d$) may be measured and calibrated such that $T_d=kT_{VCO}$. In block 1006, the quantization error is estimated. For example, the instantaneous quantization error ($e_i$) on the line 134 may be may be processed by estimator 136 to provide an estimated instantaneous quantization error ($e'_i$). As a further example, the instantaneous quantization error ($e_i$) on the line 134 may be truncated to provide an estimated instantaneous quantization error ($e'_i$) that includes the MSBs of the instantaneous quantization error ($e_i$). As a still further example, the LSBs of the instantaneous quantization error ($e_i$) may be truncated to q bits. The estimator 136 may eliminate the LSBs of the instantaneous quantization error ($e_i$) on the line 134. The number of remaining most significant bits (MSBs), q, determines the size of the q-bit array 702 of the current modification array 140, for example if 5 MSBs remain, q=5, and a 5-bit array is used.

In block 1008, a reference bias current is defined. For example, a reference bias current of $I_{cp}/(k2^q)$ may be defined by reference bias circuit 704. In block 1010, the estimated quantization error is applied to a current modification array. Applying the estimated quantization error to a current modification array may produce a down modification signal (ΔI). For example, the estimated instantaneous quantization error ($e'_i$) of block 1006 may be applied to the q-bit array 702 and the reference bias current of block 1008 may be applied to the q-bit array 702. Further, the reference bias circuit 704 may provide a reference bias for the q-bit array 702 on the line 708 where the reference bias is given by $I_{cp}/(k2^q)$. The MSBs of the instantaneous quantization error ($e_i$) may drive an array of $2^q$. The output of the q-bit array 702 may be processed by the PMOS current mirror 706.

In block 1012, a down modification signal is summed with charge pump 112 output to remove any excess charge from quantization noise. For example, the down modification signal (ΔI) generated by current modification array 140 may be summed with the charge pump current signal $I_{cp}$ at summing node 115.

Figure 11:
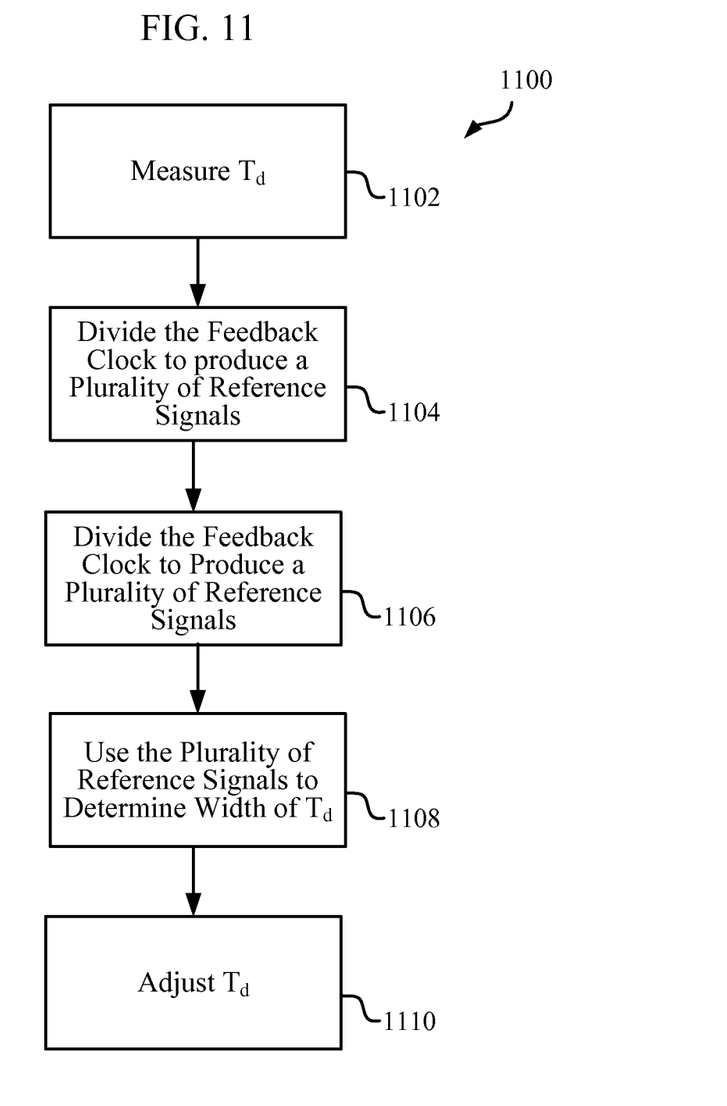
FIG. 11 is a flowchart illustrating a method of calibrating delay in the frequency synthesizer of FIG. 1.

FIG. 11 is a flowchart illustrating a method 1100 of calibrating the feedback time delay ($T_d$). The calibration ensures that $T_d = k f_{VCO}$, resulting in $T_d = kT_{VCO}$. In block 1102 of method 1100, the feedback time delay ($T_d$) is measured. The feedback time delay ($T_d$) may be measured by performing an XOR operation between the input and output of a time delay block. For example, the feedback time delay ($T_d$) may be measured by performing an XOR operation, using XOR gate 314, between the input, on the line 310, and the output on the line 312 of the time delay block 308.

In block 1104, the feedback clock is divided to produce a plurality of adjustment reference signals for calibration. In block 1104, the VCO output frequency ($f_{VCO}$) may be divided by k to provide a plurality adjustment reference signals for calibration. For example, the VCO output signal having a synthesized frequency ($f_{VCO}$) on line 122 may be divided by k in the divide by k block 320 to provide a plurality of k divided adjustment reference signals.

In block 1108, the plurality of adjustment reference signals are used to determine the width of the feedback time delay ($T_d$). In block 1108, the plurality of k divided signals may be converted to a digital delay comparison signal. For example, the plurality of adjustment reference signals on the line 322 may be processed by the time/digital converter 318. In block 1110, the time delay is adjusted. For example, the feedback time delay ($T_d$) may be adjusted to $T_d = k/f_{VCO}$ using the delay adjuster 326.

The techniques described herein result in decreased phase noise, decreased activity of the VCO control on the line 119, less complexity compare to synthesizers using a combined PFD/DACs, and the techniques described herein are immune to cancellation path mismatch of the delay through the calibrated time delay block 308. For example, the cycle to cycle variations of the $V_{ctl}$ may be eliminated through the proposed techniques. Designs described herein may result in simpler DACs because the integration of error by the digital filter increases the range quantization error.

The techniques described herein result in a reduction in required flip flops compared to combined PDF/DAC methods while reducing implementation complexity. The techniques described herein adjust the pull down current in the charge pump 112 with no high speed flip flop costs and less complexity. The techniques described herein do not generate spike currents which are higher than the typical charge-pump current value. Therefore, the proposed techniques do not generate instantaneous disturbance on the control line of VCO and therefore reduce fractional spurs. The techniques described herein eliminate the need for linear feedback shift register (LFSR) based timing mismatch compensation of the mismatches between two phases generated by PFD/DAC in combined PDF/DAC methods. This also simplifies the final implementation and reduces the cost which makes it more appealing to be used in product applications.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The circuits described herein, such as frequency synthesizer 100, may be implemented on an IC, an RFIC, a mixed-signal IC, an ASIC, a printed circuit board (PCB), etc. The circuits may also be fabricated with various IC process technologies such as CMOS, N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the techniques described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

What is claimed is:

1. An apparatus comprising:
   a phase frequency detector configured to receive a reference signal of frequency fref on a first line, receive a divider feedback signal (Div) of frequency fdiv on a second line, receive a VCO output signal of frequency fvco on a third line, and output an up current control signal (Up) and a down current control signal (Down), wherein the up current control signal comprises a sequence of up current control pulses, wherein the down current control signal comprises a sequence of down current control pulses, and wherein the phase frequency detector comprises:
   a divide by k circuit configured to receive the VCO output signal on the third line and produce a plurality of adjustment reference signals (Vars) based at least in part on the frequency fvco of the received VCO output signal;
   a time/digital converter configured to receive the plurality of adjustment reference signals (Vars) from the divide by k circuit and produce a delay compensation signal (Dcomp) based at least in part on the plurality of adjustment reference signals (Vars); and
   a delay adjuster configured to receive the delay compensation signal (Dcomp) from the time/digital converter and produce a delay adjustment signal based at least in part on the received delay compensation signal (Dcomp), wherein the phase frequency detector is further configured to control the up current control pulses to have an up pulse duration calibrated to be a fixed multiple of a period of the VCO output signal based at least in part on the delay adjustment signal;
   a charge pump circuit configured to receive the up current control signal and the down current control signal and to output a charge pump output current signal (Icp);
   a loop filter configured to receive a sum of the charge pump output current signal (Icp) and a down modification signal (ΔI) and to output a control signal (Vctl);
   a divider configured to receive the VCO output signal on a fourth line and to output the divider feedback signal (Div) to the phase frequency detector on the second line;
   a voltage controlled oscillator (VCO) configured to receive the control signal (Vctl), to output the VCO output signal to the phase frequency detector on the third line, and to output the VCO output signal to the divider on the fourth line; and
   a down modification signal generating circuit configured to receive an instantaneous quantization error signal (ei) and to output the down modification signal (ΔI).

2. The apparatus of claim 1, wherein the charge pump output current signal (Icp) comprises up current pulses and down current pulses, wherein the up current pulses are of substantially identical amplitude and are controlled to be of substantially identical duration, and wherein the down current pulses are of varying amplitude and are of varying duration.

3. The apparatus of claim 1, wherein the phase frequency detector comprises:
   a first flip-flop having a clock input configured to receive the reference signal on the first line, a reset input, and an output;
   a second flip-flop having a clock input configured to receive the divider feedback signal (Div) on the second line, a reset input, and an output;
   a first gate having a first input coupled to the output of the first flip-flop, a second input coupled to the output of the second flip-flop, and an output coupled to the reset input of the second flip-flop;
   a feedback time delay circuit having a first input coupled to the output of the first gate, a second input, and an output coupled to the reset input of the first flip-flop; and
   a control circuit configured to receive the VCO output signal on the third line and to supply a delay adjustment signal onto the second input of the feedback time delay circuit.

4. An apparatus, comprising:
   a phase frequency detector configured to receive a reference signal of frequency fref on a first line, receive a divider feedback signal (Div) of frequency fdiv on a second line, and receive a VCO output signal of frequency fvco on a third line, and to output an up current control signal (Up) and a down current control signal (Down), wherein the up current control signal comprises a sequence of up current control pulses, wherein the down current control signal comprises a sequence of down current control pulses, wherein the up current control pulses are controlled to have an up pulse duration that is a fixed multiple of a period of the VCO output signal, wherein the phase frequency detector comprises:
   a first flip-flop having a clock input configured to receive the reference signal on the first line, a reset input, and an output;
   a second flip-flop having a clock input configured to receive the divider feedback signal (Div) on the second line, a reset input, and an output;
   a first gate having a first input coupled to the output of the first flip-flop, a second input coupled to the output of the second flip-flop, and an output coupled to the reset input of the second flip-flop;
   a feedback time delay circuit having a first input coupled to the output of the first gate, a second input, and an output coupled to the reset input of the first flip-flop; and
   a control circuit configured to receive the VCO output signal on the third line and to supply a delay adjustment signal onto the second input of the feedback time delay circuit, wherein the control circuit comprises:
   a second gate having a first input coupled to the input of the feedback time delay circuit, a second input coupled to the output of the feedback time delay circuit, and an output;

a divide by k circuit having an input configured to receive the VCO output signal on the third line and an output configured to provide a plurality of adjustment reference signals (Vars);
a time/digital converter having a first input configured to receive an output signal (Vpul) from the output of the second gate, a second input configured to receive the plurality of adjustment reference signals (Vars) from the output of the divide by k circuit, and an output configured to provide a delay compensation signal (Dcomp); and
a delay adjuster having an input configured to receive the delay compensation signal (Dcomp) from the output of the time/digital converter and an output configured to provide a delay adjustment signal onto a second input of the feedback time delay circuit;
a charge pump circuit configured to receive the up current control signal and the down current control signal and to output a charge pump output current signal (Icp);
a loop filter configured to receive a sum of the charge pump output current signal (Icp) and a down modification signal ($\Delta I$) and to output a control signal (Vctl);
a divider configured to receive the VCO output signal on a fourth line and to output the divider feedback signal (Div) to the phase frequency detector on the second line;
a voltage controlled oscillator (VCO) configured to receive the control signal (Vctl), to output the VCO output signal to the phase frequency detector on the third line, and to output the VCO output signal to the divider on the fourth line; and
a down modification signal generating circuit configured to receive an instantaneous quantization error signal (ei) and to output the down modification signal ($\Delta I$).

5. An apparatus comprising:
a phase frequency detector configured to receive a reference signal of frequency fref, a divider feedback signal (Div) of frequency fdiv, and a VCO output signal of frequency fvco, and to output an up current control signal (Up) and a down current control signal (Down), wherein the up current control signal comprises a sequence of up current control pulses, wherein the down current control signal comprises a sequence of down current control pulses, wherein the up current control pulses are controlled to have an up pulse duration that is a fixed multiple of a period of the VCO output signal, wherein the phase frequency detector comprises:
a first flip-flop having a reset input and an output;
a second flip-flop having a reset input and an output;
a first gate having a first input coupled to the output of the first flip-flop, a second input coupled to the output of the second flip-flop, and an output coupled to the reset input of the second flip-flop;
a feedback time delay circuit having a first input coupled to the output of the first gate, a second input, and an output coupled to the reset input of the first flip-flop; and
a control circuit configured to supply a delay adjustment signal onto the second input of the feedback time delay circuit, wherein the control circuit comprises:
a second gate having a first input coupled to the input of the feedback time delay circuit, a second input coupled to the output of the feedback time delay circuit, and an output;
a time/digital converter having an input and an output, wherein the input is coupled to the output of the second gate;
a delay adjuster having an input and an output, wherein the input is coupled to the output of the time/digital converter, wherein the output is coupled to a second input of the feedback time delay circuit; and
a divider configured to receive the VCO output signal of frequency fvco, wherein the divider is configured to supply a plurality of adjustment reference signals (Vars) to the time/digital converter;
a charge pump circuit configured to receive the up current control signal and the down current control signal and to output a charge pump output current signal (Icp);
a loop filter configured to receive a sum of the charge pump output current signal and a down modification signal ($\Delta I$) and to output a control signal (Vctl);
a voltage controlled oscillator (VCO) configured to receive the control signal Vctl and to output the VCO output signal;
a divider configured to receive the VCO output signal and to output the divider feedback signal; and
a down modification signal generating circuit configured to receive an instantaneous quantization error signal (ei) and to output the down modification signal ($\Delta I$).

6. The apparatus of claim 5, wherein each of the adjustment reference signals has a frequency of fvco/k, where k is an integer.

7. The apparatus of claim 1, wherein the phase frequency detector has a control loop that controls the up pulse duration to be the fixed multiple of the period of the VCO output signal.

8. The apparatus of claim 1, wherein the down modification signal generating circuit comprises:
a reference bias circuit configured to output a reference bias signal;
a q-bit array configured to receive the reference bias signal and an estimated instantaneous quantization error signal (e'i);
an estimator circuit configured to receive the instantaneous quantization error signal (ei) and to output the estimated instantaneous quantization error signal (e'i); and
a PMOS current minor circuit having an input coupled to the q-bit array, wherein the PMOS current mirror circuit is configured to output the down modification signal ($\Delta I$).

9. The apparatus of claim 8, wherein the instantaneous quantization error signal (ei) is a multi-bit signal having q bits, and wherein the reference bias signal is a current signal given by: $Icp/(k2^q)$, were k is an integer.

10. The apparatus of claim 1, wherein the instantaneous quantization error signal (ei) indicates an instantaneous quantization error ei, wherein the down modification signal ($\Delta I$) is given by: $\Delta I \approx (Icp/k)ei$, where k is an integer.

11. The apparatus of claim 1, further comprising:
a sigma delta modulator configured to receive a channel selection signal and to output a divider selection signal, wherein the divider selection signal is supplied to the divider; and
a summing node configured to combine the channel selection signal with an inverse of the divider selection signal thereby providing the instantaneous quantization error signal (ei).

12. An apparatus comprising:
a phase frequency detector configured to receive a reference signal of frequency fref on a first line, receive a divider feedback signal (Div) of frequency fdiv on a second line, receive a VCO output signal of frequency fvco on a third line, and output an up current control signal (Up) and a down current control signal (Down), wherein the up current control signal comprises a sequence of up current control pulses, wherein the down current control signal comprises a sequence of down current control pulses, and wherein the phase frequency detector comprises:

means for producing a plurality of adjustment reference signals (Vars) based at least in part on the frequency fvco of the VCO output signal received on the third line;

means for producing a delay compensation signal (Dcomp) based at least in part on the plurality of adjustment reference signals (Vars);

means for producing a delay adjustment signal based at least in part on the delay compensation signal (Dcomp); and means for controlling the up current control pulses to have an up pulse duration calibrated to be a fixed multiple of a period of the VCO output signal based at least in part on the delay adjustment signal;

a charge pump circuit configured to receive the up current control signal and the down current control signal and to output a charge pump output current signal (Icp);

a loop filter configured to receive a sum of the charge pump output current signal (Icp) and a down modification signal (ΔI) and to output a control signal (Vctl);

a divider configured to receive the VCO output signal on a fourth line and to output the divider feedback signal (Div) to the phase frequency detector on the second line; and a voltage controlled oscillator (VCO) configured to receive the control signal (Vctl), to output the VCO output signal to the phase frequency detector on the third line, and to output the VCO output signal to the divider on the fourth line.

13. The apparatus of claim 12, wherein the means controls the up current control pulses in a control loop to have a substantially constant up pulse duration.

14. The apparatus of claim 13, wherein the means does not control the down current control pulses, and wherein the down current control pulses do not have a substantially constant down pulse duration.

15. The apparatus of claim 12, further comprising:
a down modification signal generating means for receiving an instantaneous quantization error signal (ei) and for outputting the down modification signal (ΔI).

16. The apparatus of claim 15, wherein the down modification signal generating means outputs the down modification signal (ΔI) such that ΔI≈(Icp/k)ei, where k is an integer, and where ei is an instantaneous quantization error indicated by the instantaneous quantization error signal (ei).

17. A method comprising:
(a) generating a signal indicative of a feedback time delay (Td), where the feedback time delay is a delay through a feedback time delay circuit, wherein the feedback time delay circuit is a part of a phase frequency detector, wherein an output of the feedback time delay circuit is coupled to a reset input of a first flip-flop of the phase frequency detector, wherein an input of the feedback time delay circuit is coupled to a reset input of a second flip-flop of the phase frequency detector, wherein the first flip-flop outputs an up current control signal, and wherein the second flip-flop outputs a down current control signal;
(b) receiving the up current control signal and the down current control signal onto a charge pump circuit and using the up current control signal and the down current control signal to generate a charge pump output current signal (Icp);
(c) generating a plurality of adjustment reference signals (Vars), where each of the adjustment reference signals has a frequency of fvcok, where fvco is a frequency of a voltage controlled oscillator (VCO) output signal, and where k is an integer; and
(d) using the signal indicative of the feedback time delay and the plurality of adjustment reference signals to control the feedback time delay circuit such that the up current control signal comprises up current control pulses that have an up pulse duration that is a fixed multiple of a period of the VCO output signal.

18. The method of claim 17, wherein the down current control signal comprises down current control pulses that do not have a substantially constant down pulse duration.

19. The method of claim 17, wherein the signal indicative of the feedback time delay (Td) is a signal (Vpul) output by a gate, wherein a first input of the gate is coupled to the input of the feedback time delay circuit, and wherein a second input of the gate is coupled to the output of the feedback time delay circuit.

20. The method of claim 17, wherein the using of (d) involves using a control loop to control the feedback time delay circuit.

21. The method of claim 17, further comprising:
(e) generating an instantaneous quantization error signal (ei) indicative of an instantaneous quantization error ei;
(f) summing the charge pump output current signal (Icp) with a down modification signal (ΔI) and thereby generating a sum signal (Icp+ΔI);
(g) filtering the sum signal using a loop filter; and
(h) receiving the instantaneous quantization error signal (ei) and generating the down modification signal (ΔI) based at least in part on the instantaneous quantization error signal (ei) such that ΔI≈(Icp/k)ei, where k is an integer, and where ei is the instantaneous quantization error.

22. The method of claim 21, wherein the charge pump output current signal (Icp) comprises up current pulses and down current pulses, wherein the up current pulses of are substantially identical amplitude and are controlled to be of substantially identical duration, and wherein the down current pulses are of varying amplitude and are of varying duration.

23. The apparatus of claim 1, wherein the up current control pulses are controlled to have the up pulse duration be the fixed multiple of the period of the VCO output signal regardless of whether the divider feedback signal (Div) leads or lags the reference signal in phase.

24. An apparatus comprising:
means for generating a signal indicative of a feedback time delay (Td) through a feedback time delay circuit that is part of a phase frequency detector having a first flip-flop that outputs an up current control signal and a second flip-flop that outputs a down current control signal, wherein the time delay circuit has an output coupled to a reset input of the first flip-flop and an input coupled to a reset input of the second flip-flop;
means for receiving the up current control signal and the down current control signal and using the up current control signal and the down current control signal to generate a charge pump output current signal (Icp);
means for generating a plurality of adjustment reference signals (Vars) that each have a frequency of fvcok, where fvco is a frequency of a voltage controlled oscillator (VCO) output signal and k is an integer; and means for using the signal indicative of the feedback time delay (Td) and the plurality of adjustment reference signals (Vars) to control the feedback time delay circuit such that the up current control signal comprises up current control pulses that have an up pulse duration that is a fixed multiple of a period of the VCO output signal.

25. An apparatus comprising:

means for receiving a reference signal of frequency fref on a first line, receiving a divider feedback signal (Div) of frequency fdiv on a second line, receiving a VCO output signal of frequency fvco on a third line, producing a plurality of adjustment reference signals (Vars) based at least in part on the frequency fvco of the VCO output signal received on the third line, producing a delay compensation signal (Dcomp) based at least in part on the plurality of adjustment reference signals (Vars), producing a delay adjustment signal based at least in part on the delay compensation signal (Dcomp), outputting an up current control signal (Up) that comprises a sequence of up current control pulses controlled to have an up pulse duration calibrated to be a fixed multiple of a period of the VCO output signal based at least in part on the delay adjustment signal, and outputting a down current control signal (Down) that comprises a sequence of down current control pulses;

means for receiving the up current control signal, receiving the down current control signal, and outputting a charge pump output current signal (Icp);

means for receiving a sum of the charge pump output current signal (Icp), receiving a down modification signal (ΔI), and outputting a control signal (Vctl);

means for receiving the VCO output signal on a fourth line and supplying the divider feedback signal (Div) onto the second line; and means for receiving the control signal (Vctl), supplying the VCO output signal onto the third line, and supplying the VCO output signal onto the fourth line.

26. The apparatus of claim 25, further comprising means for receiving an instantaneous quantization error signal (ei) and outputting the down modification signal (ΔI).

27. The apparatus of claim 1, wherein the up current control signal (Up) indicates a phase difference between the reference signal received on the first line and the divider feedback signal (Div) received on the second line, and wherein the down current control signal (Down) corrects quantization noise error in the up current control signal.

28. The apparatus of claim 12, wherein the up current control signal (Up) indicates a phase difference between the reference signal received on the first line and the divider feedback signal (Div) received on the second line, and wherein the down current control signal (Down) corrects quantization noise error in the up current control signal.

29. The apparatus of claim 25, wherein the up current control signal (Up) indicates a phase difference between the reference signal received on the first line and the divider feedback signal (Div) received on the second line, and wherein the down current control signal (Down) corrects quantization noise error in the up current control signal.

* * * * *